United States Patent
Lee

(10) Patent No.: US 7,532,531 B2
(45) Date of Patent: May 12, 2009

(54) FLASH MEMORY DEVICE AND MULTI-BLOCK ERASE METHOD

(75) Inventor: Doo-Sub Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/776,620

(22) Filed: Jul. 12, 2007

(65) Prior Publication Data

US 2008/0025100 A1 Jan. 31, 2008

(30) Foreign Application Priority Data

Jul. 31, 2006 (KR) .................. 10-2006-0072205

(51) Int. Cl.
*G11C 7/00* (2006.01)

(52) U.S. Cl. ............. 365/218; 365/185.29; 365/185.33; 365/185.3; 365/185.18

(58) Field of Classification Search ................ 365/218, 365/185.29, 185.33, 185.3, 185.18
See application file for complete search history.

(56) References Cited

U.S. PATENT DOCUMENTS

| | | | |
|---|---|---|---|
| 5,608,672 A * | 3/1997 | Tang et al. ............... | 365/185.3 |
| 5,777,924 A | 7/1998 | Lee et al. | |
| 5,822,252 A | 10/1998 | Lee et al. | |
| 5,920,506 A * | 7/1999 | Wang et al. ............. | 365/185.18 |
| 6,055,184 A | 4/2000 | Acharya et al. | |
| 6,529,413 B2 * | 3/2003 | Lee et al. ................ | 365/185.22 |
| 6,865,125 B2 | 3/2005 | Tanzawa et al. | |
| 6,891,752 B1 | 5/2005 | Bautista et al. | |
| 6,937,524 B2 * | 8/2005 | Shiga et al. .............. | 365/185.3 |
| 7,046,559 B2 | 5/2006 | Saito | |
| 7,130,219 B2 * | 10/2006 | Conte et al. ............ | 365/185.18 |
| 7,318,117 B2 * | 1/2008 | Lee et al. ..................... | 711/103 |
| 2002/0036925 A1 | 3/2002 | Tanzawa et al. | |

FOREIGN PATENT DOCUMENTS

| | | | |
|---|---|---|---|
| JP | 10172291 | | 6/1998 |
| JP | 2000149574 | | 5/2000 |
| JP | 02002133882 A | * | 5/2002 |
| JP | 2005092948 | | 4/2005 |
| KR | 1020010061506 A | | 7/2001 |
| KR | 1020060014342 A | | 2/2006 |
| KR | 1020060024146 A | | 3/2006 |

* cited by examiner

*Primary Examiner*—Viet Q Nguyen
(74) *Attorney, Agent, or Firm*—Volentine & Whitt, PLLC

(57) ABSTRACT

In a flash memory device, a multi-block erase operation is performed by applying stepwise increasing erase voltages to selected memory blocks during a first erase period and then applying fixed erase voltages to the selected memory blocks during a second erase period. Once a selected memory block is successfully erased in the first erase period, the device prevents erase voltages from being applied to the selected memory block for a remaining part of the first erase period.

10 Claims, 9 Drawing Sheets

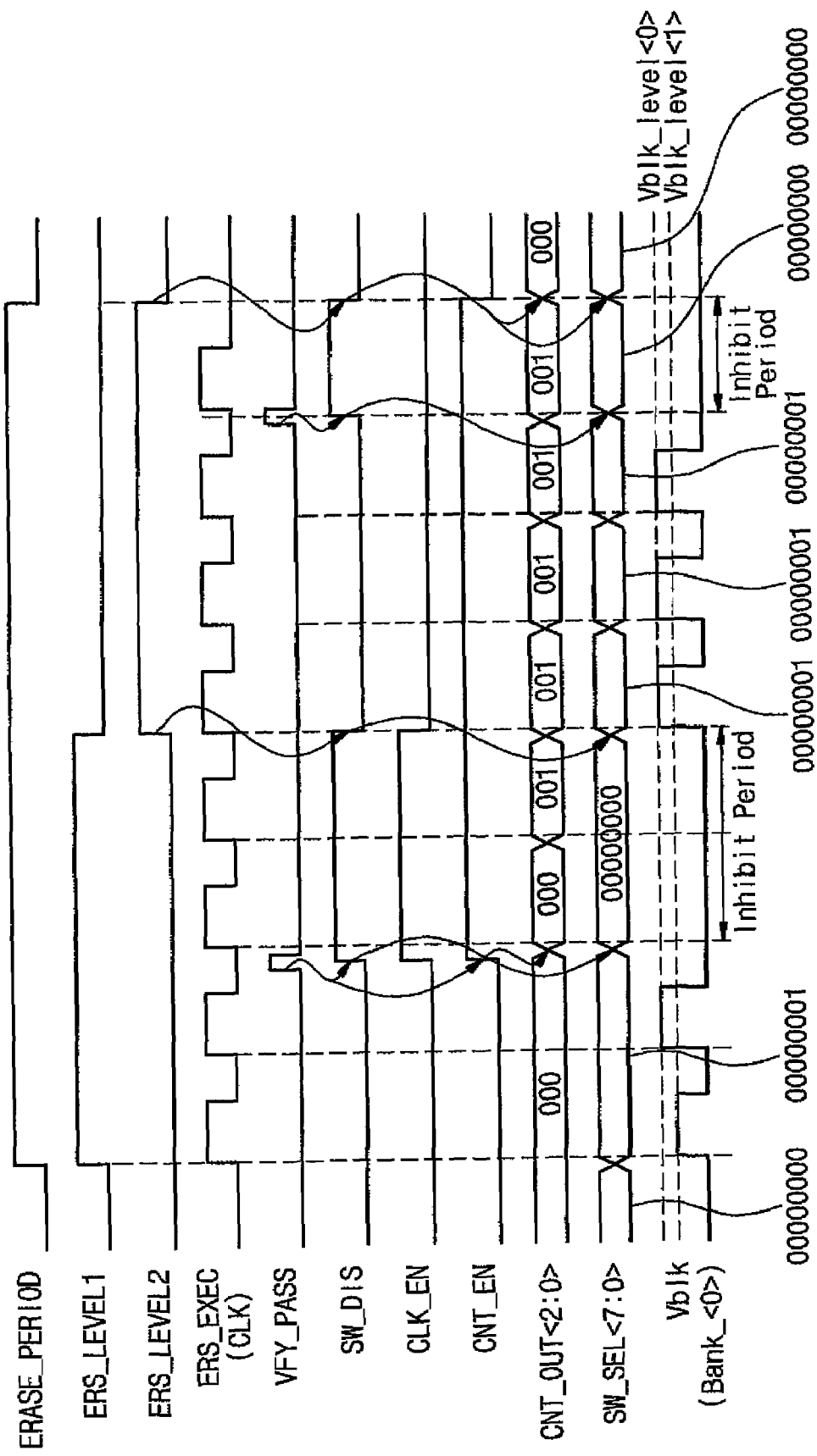

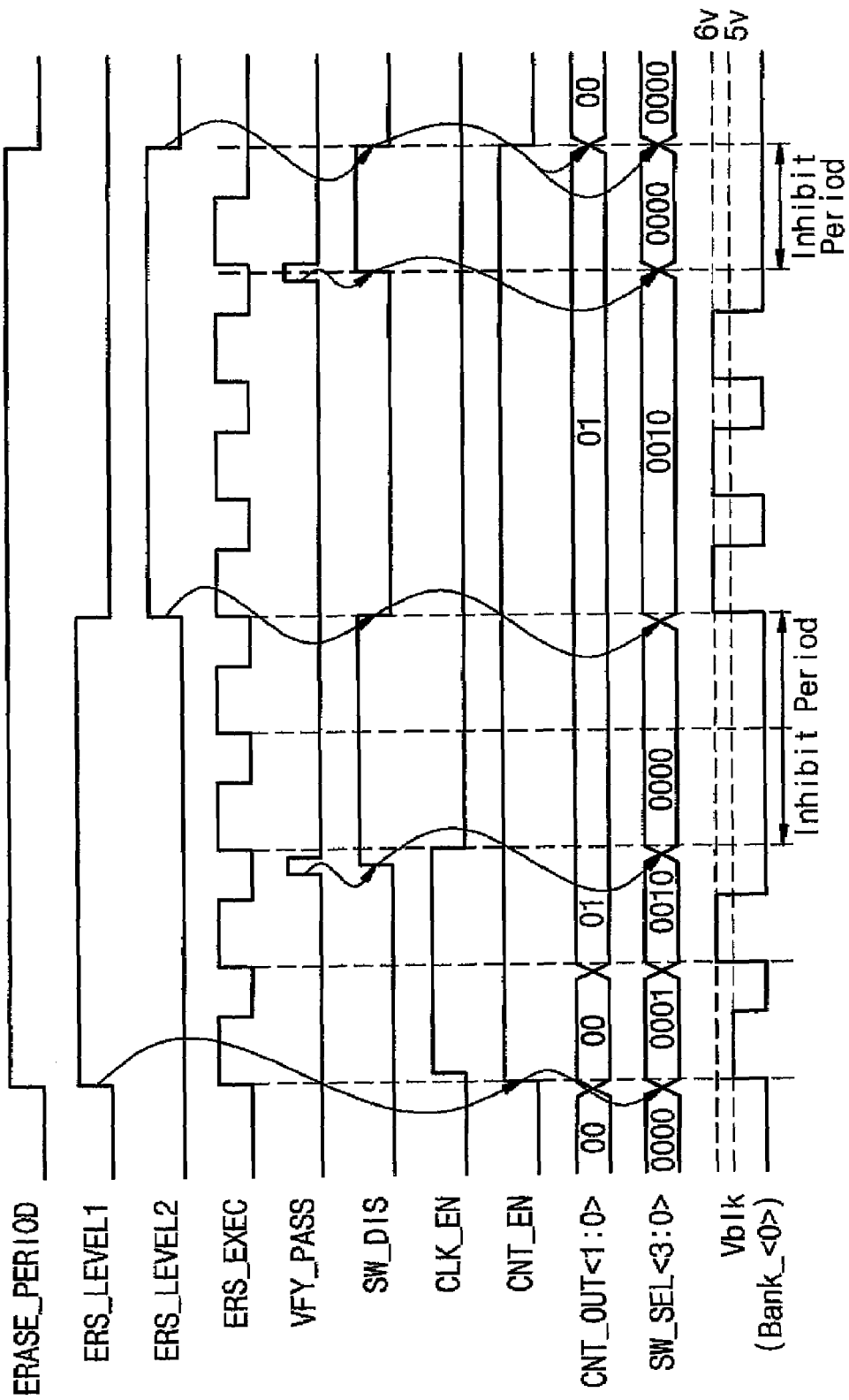

FLASH MEMORY DEVICE AND MULTI-BLOCK ERASE METHOD

CROSS-REFERENCE TO RELATED APPLICATIONS

This application claims priority to Korean Patent Application No. 10-2006-0072205, filed on Jul. 31, 2006, the disclosure of which is hereby incorporated by reference in its entirety.

BACKGROUND OF THE INVENTION

1. Field of the Invention

Embodiments of the invention relate generally to semiconductor memory devices. More particularly, selected embodiments of the invention relate to flash memory devices and related methods for performing multi-block erase operations.

2. Description of Related Art

A flash memory device comprises a plurality of memory cells arranged in a matrix. Typically, the memory cells are programmed or read individually or in page units and are erased in units of memory blocks or sectors.

In a conventional erase operation of a NOR flash memory device, a voltage of about 6 to 10V is applied to a bulk region of a selected memory block region and a voltage about −10V is applied to corresponding selected word lines while corresponding selected bit and source lines are maintained in a floating state. Under these bias conditions, stored electrons are removed from the floating gates of selected memory cells via Fowler-Nordheim (FN) tunneling.

In more recent flash memory devices, this conventional erase operation is simultaneously used on multiple memory blocks in a multi-block erase operation. Typically, the multi-block erase operation simultaneously erases at least one block from each of a plurality of memory banks. By using the multi-block erase operation, the time required to simultaneously erase several blocks can be significantly reduced. Such a reduction in erase time can be especially useful, for example, during test operations where large numbers of memory blocks are erased.

FIG. 1 is a waveform diagram of bulk voltages applied to selected memory banks during a conventional multi-block erase operation of a NOR-type flash memory device. Referring to FIG. 1, during a first erase period ERS_1, bulk voltages applied to selected memory blocks in corresponding banks BANK<0> through BANK<N−1> are increased or "stepped up" in successive erase loops. Then, during a second erase period ERS_2, the bulk voltages applied to the selected memory blocks are maintained at a substantially constant voltage level for several erase loops.

In each erase loop of first erase period ERS_1, an erase operation is performed and then an erase-verify operation is performed to detect whether all selected memory cells in each selected memory block have been successfully erased. In second erase period ERS_2, the bulk voltages of the selected memory blocks are maintained at the predetermined voltage level in order to establish a desired threshold voltage distribution in the selected memory cells of each selected memory block.

In the diagram of FIG. 1, a dotted line illustrates a bulk voltage level at which each selected memory block in each corresponding bank is detected to be successfully erased. For example, the selected memory block in bank BANK<0> is detected to be successfully erased in a fifth erase loop of first erase period ERS_1, the selected memory block in bank BANK<1> is detected to be successfully erased in a fourth erase loop of first erase period ERS_1, and the selected memory block in bank BANK<N−1> is detected to be successfully erased in a third erase loop of first erase period ERS_1.

As illustrated by FIG. 1, the same bulk voltages are applied to all of the selected memory blocks throughout the multi-block erase operation, regardless of when each block is detected to be successfully erased.

SUMMARY OF THE INVENTION

According to one embodiment of the invention, a method of performing a multi-block erase operation in a flash memory device is provided. The multi-block erase operation comprises first and second erase periods. In the first erase period, a first plurality of erase loops is performed on a plurality of memory blocks, wherein performing an initial one of the first plurality of erase loops comprises applying respective bulk voltages to each of the plurality of memory blocks and detecting whether each of the plurality of memory blocks has been successfully erased, and wherein performing subsequent erase loops among the plurality of erase loops comprises applying respective stepped-up bulk voltages to each of the plurality of memory blocks that has not been detected to be successfully erased while interrupting the supply of bulk voltages to any of the plurality of memory blocks that has been detected to be successfully erased. In the second erase period, a second plurality of erase loops is performed on the plurality of memory blocks, wherein performing each of the second plurality of erase loops comprises applying respective fixed-level bulk voltages to the plurality of memory blocks.

According to another embodiment of the invention, a method for simultaneously erasing a plurality of memory blocks in a flash memory device is provided. The method comprises (a) applying an erase voltage to respective bulk regions of the plurality of memory blocks, (b) detecting whether the plurality of memory blocks have been successfully erased, (c) upon detecting that at least one of the plurality of memory blocks is not successfully erased, increasing the level of the erase voltage and repeating (a) and (b) for all of the plurality of memory blocks that are not successfully erased while preventing the erase voltage from being supplied to any memory blocks that were detected to be successfully erased in (b), (d) upon detecting that all of the memory blocks are successfully erased, providing each of the respective bulk regions of the plurality of memory blocks with respective bulk voltages having the same respective levels as the last respective erase voltages applied thereto in (a), and (e) repeating (d).

According to still another embodiment of the invention, a flash memory device is provided. The device comprises a memory cell array comprising a plurality of memory blocks, a sense amplifier detecting data stored in selected memory blocks among the plurality of memory blocks, a pass/fail detector determining whether the respective selected memory blocks have been erased based on the data detected by the sense amplifier and outputting erase-verify signals indicating respective results of the determinations for each of the selected memory blocks, and an erase voltage generation unit providing respective erase voltages to the selected memory blocks in response to the corresponding erase-verify signals, wherein the respective voltage levels of the erase voltages increase with successive erase loops performed on each of the selected memory blocks within a first erase period of an erase operation, and the respective voltage levels of the erase voltages stay the same within a second erase period of the erase operation. Each of the selected memory blocks is prevented from receiving the corresponding erase voltage during the first erase period if the corresponding erase-verify signal indicates that the selected memory block has been successfully erased.

According to still another embodiment of the invention, a flash memory device is provided. The device comprises a memory cell array comprising a plurality of memory blocks, a sense amplifier detecting data stored in a selected memory block among the plurality of memory blocks, a pass/fail detector determining whether the selected memory block has been erased based on the data detected by the sense amplifier and outputting a erase-verify signal indicating a result of the determination, an erasing controller operating to control an erase period of an erase operation in response to the erase-verify signal, an erase voltage generator operating to generate an erase voltage under the control of the erasing controller, and an erase voltage selector selecting the erase voltage by switching among a plurality of stepwise increasing erase voltages or fixed erase voltages during the erase period, and supplying the selected erase voltage to the selected memory block. The erase voltage increases between successive erase loops of a first erase period of an erase operation, the erase voltage remains substantially fixed during a second erase period of the erase operation, and the erase voltage selector interrupts the supply of the erase voltage to the selected memory block in response to the erase-verify signal when the selected memory block is detected to be successfully programmed in the first erase period.

BRIEF DESCRIPTION OF THE DRAWINGS

Embodiments of the invention are described below in relation to the accompanying drawings. Throughout the drawings, like reference numbers indicate like exemplary elements, components, and steps. In the drawings:

FIG. 5B is a timing diagram illustrating the operation of the bulk voltage selector in accordance with the embodiment of FIG. 5A;

FIG. 6B is a timing diagram illustrating the operation of the bulk voltage selector in accordance with the embodiment of FIG. 6A.

DESCRIPTION OF EXEMPLARY EMBODIMENTS

Exemplary embodiments of the invention are described below with reference to the corresponding drawings. These embodiments are presented as teaching examples while the actual scope of the invention is defined by the claims that follow.

Figure 1:
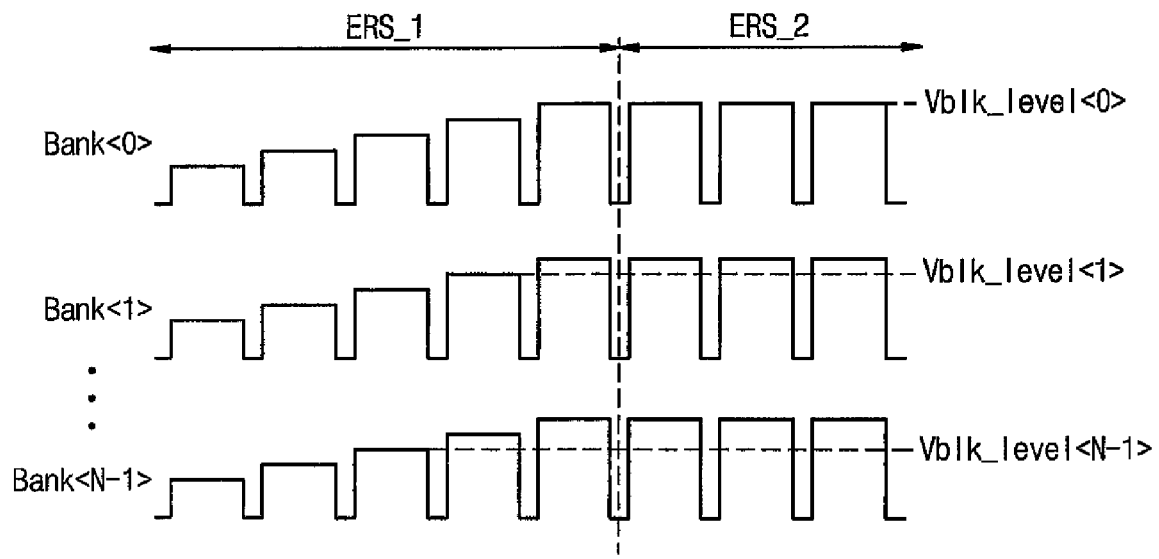
FIG. 1 is a waveform diagram of bulk voltages applied to selected memory blocks during a conventional multi-block erase operation.
Figure 2:
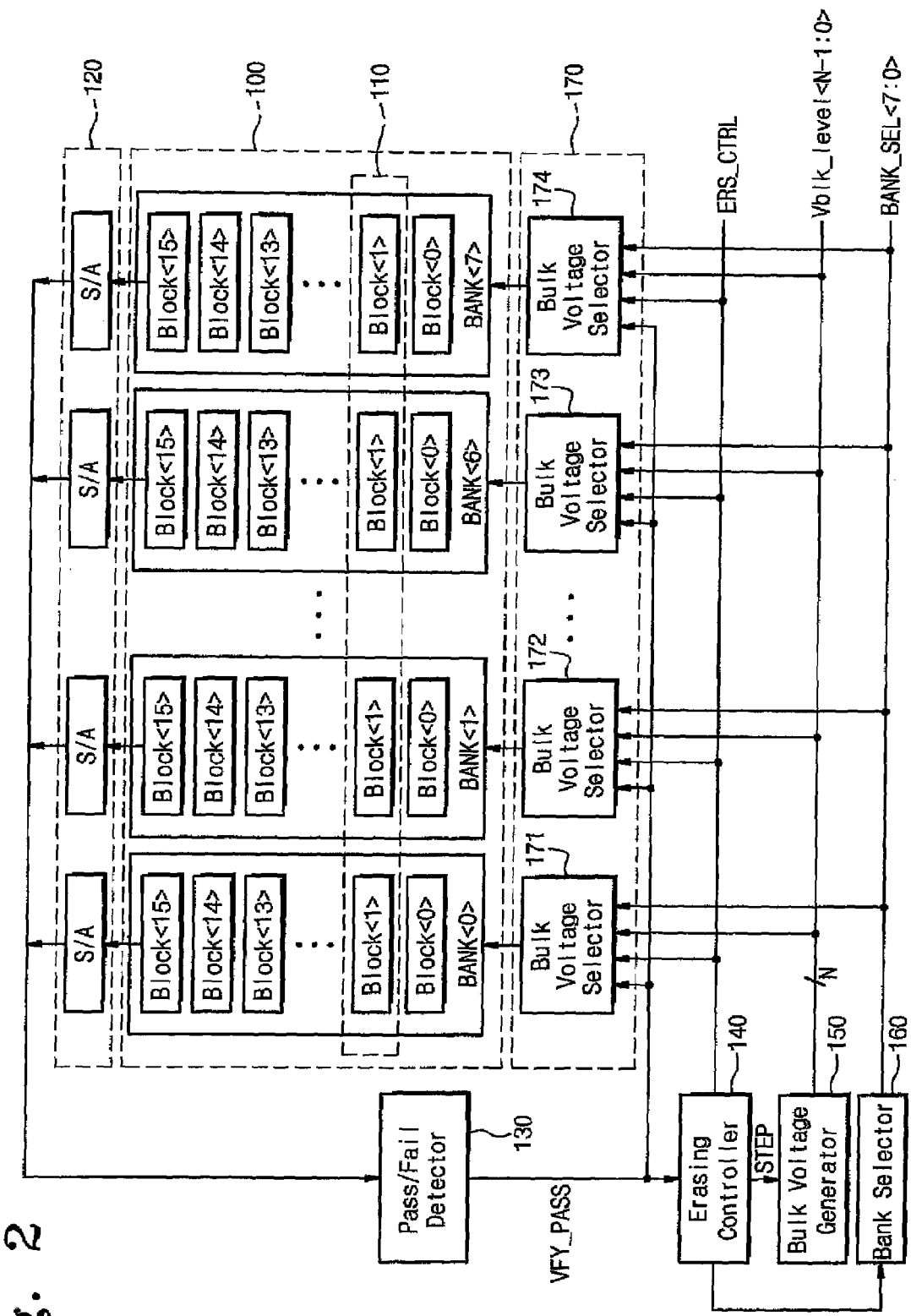
FIG. 2 is a block diagram of a memory device capable of conducting a multi-block erase operation in accordance with an embodiment of the invention.

FIG. 2 is a block diagram of a memory device capable of conducting a multi-block erase operation in accordance with an embodiment of the invention. In the device of FIG. 2, erase-verify operations are carried out on selected memory blocks during a multi-block erase operation. Based on the results of the erase-verify operations, different bulk voltages may be applied each to different selected memory blocks.

Referring to FIG. 2, a memory cell array 100 comprises a plurality of banks BANK<0-7>. Each bank comprises a plurality of memory blocks Block<0-15> each constituting an independent unit of erasure. During an erase operation, word lines of selected memory cells are supplied with a negative voltage about −10V and a bulk region shared by the selected memory cells is supplied with a bulk voltage between about 6 and 7V.

A multi-block 110 in FIG. 2 corresponds to a unit of erasure for a multi-block erase operation. During the multi-block erase operation, one memory block is selected in each of banks BANK<0~7>. Multi-block 110 includes memory blocks all having the same row address; however, a multi-block erase operation could alternatively erase memory blocks having different row addresses in different banks. Nevertheless, in at least one type of operation designed to erase all of the memory blocks in memory array 100, a row address can be incremented to sequentially select different multi-blocks.

A sense amplifier block 120 comprises sense amplifiers S/A corresponding to respective banks BANK<0~7>. Sense amplifier S/A detects data from selected memory blocks, e.g., in word units. Data detected by sense amplifier S/A is transferred to an input/output buffer (not shown). During an erase verify operation, data detected by sense amplifier S/A is transferred to a pass/fail detector 130. In the embodiment of FIG. 2, data from different banks is generally transferred to pass/fail detector 130 in sequence. However, in other embodiments, the data could be transferred to a plurality of pass/fail detectors in parallel.

Pass/fail detector 130 evaluates detected data to determine whether selected memory blocks have been successfully erased. Based on this evaluation pass/fail detector 130 generates an erase-verify signal VFY_PASS for each selected memory block. Pass/fail detector 130 provides erase-verify signal VFY_PASS to an erasing controller 140 and to a bulk voltage selection block 170 providing bulk voltages to the selected memory blocks for the multi-block erase operation.

Erasing controller 140 operates to control a bulk voltage generator 150 and a bank selector 160 in response to erase-verify signal VFY_PASS. Erasing controller 140 provides bulk voltage generator 150 with a step signal STEP to control generation of a step voltage. Erasing controller 140 operates to control bank selector 160 for generating a bank selection signal BANK_SEL that controls the selection of a selected memory bank to which the bulk voltage is applied.

Erasing controller 140 generates an erasing control signal ERS_CTRL to control bulk voltage selectors 171 through 174 included in bulk voltage selection block 170. Erasing control signal ERS_CTRL is activated to control bulk voltage selectors 171 through 174 to provide different bulk voltages into respective bulk regions of selected memory blocks in different corresponding memory banks.

During a first erase loop of a first erase period ERS_1 of the multi-block erase operation, step pulses having the same voltage level are applied each to the respective bulks of the memory blocks in multi-block 110. However, in subsequent erase loops, memory blocks of multi-block 110 that are detected to be successfully erased in an erase-verify operation are not erased. Instead, controller 140 prevents step pulses from being applied to the memory blocks that are detected to be successfully erased. On the other hand, in subsequent erase loops, memory blocks of multi-block 110 that are detected to be not-successfully erased in an erase-verify operation are erased using a bulk voltage having a successively stepped-up voltage level.

Once all memory blocks in multi-block 110 are detected to be successfully erased, first erase period ERS_1 is terminated and a second erase period ERS_2 begins. During second erase period ERS_2, each memory block in multi-block 110 receives a bulk voltage having the same voltage level as the last step pulse applied thereto during first erase period ERS_1. Accordingly, different memory blocks in multi-block 110 may receive bulk voltages having different levels during second erase period ERS_2.

Alternatively, during second erase period ERS_2, each memory block in multi-block 110 could receive a bulk voltage with a different voltage level from the last step pulse applied thereto during first erase period ERS_1 while still providing different bulk voltages to different memory blocks to achieve a desired result.

In addition, a separate pass/fail detector 130 could be included in each bank. In such a case, selected blocks in all banks could be simultaneously erased without requiring bank selector 160.

Figure 3:
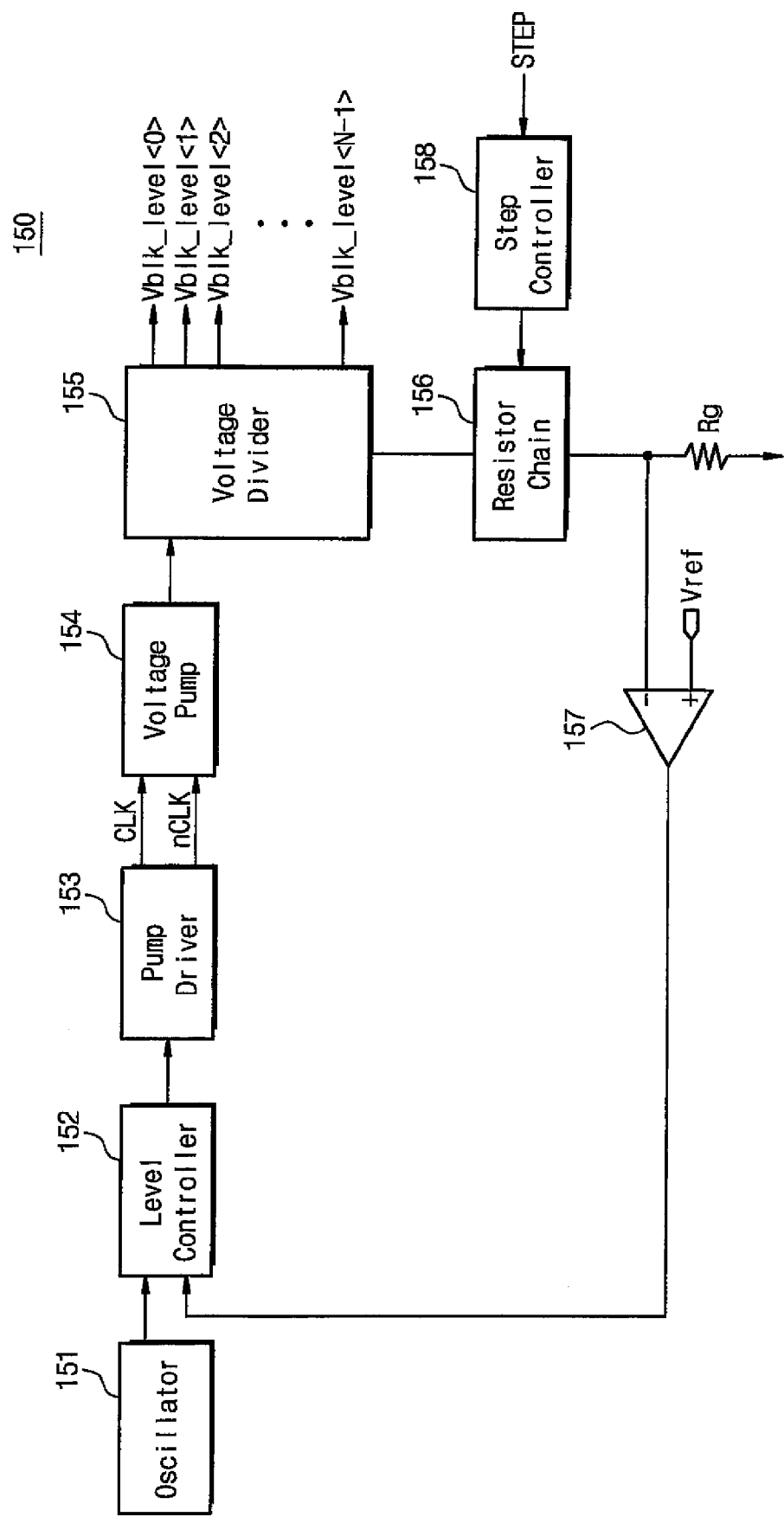
FIG. 3 is a block diagram of a bulk voltage generator shown in FIG. 2.

FIG. 3 is a block diagram of bulk voltage generator 150 shown in FIG. 2. Referring to FIG. 3, bulk voltage generator 150 generates a high voltage using a high voltage pump 154. A voltage divider 155 then divides the high voltage into a plurality of bulk voltages Vblk_level<0> through Vblk_level<N−1> having different voltage levels.

The bulk voltages are output as step pulses or fixed-level pulses based on switching operations of a resistor chain 156 under the control of a step controller 158.

An oscillator 151 generates a sinusoidal wave with a regular frequency to generate clock signals CLK and nCLK for driving high voltage pump 154. A level controller 152 facilitates or interrupts the transmission of the sinusoidal wave to a pump driver 153 in response to a comparison result output from a comparator 157. Pump driver 153 generates clock signals CLK and nCLK to drive voltage pump 154. Voltage pump 154 outputs a high voltage Vblk_level<0> or Vblk_level<N−1> with a constant level in accordance with a frequency of clock signals CLK and nCLK. Voltage divider 155 operates to divide output voltage Vblk_level<0> or Vblk_level<N−1> using a series of resistors and outputs divided voltages Vblk_level<1~N−1> or Vblk_level<0~N−2>.

Resistor chain 156 comprises a combination circuit of resistors and switches for providing bulk voltages Vblk_level<0~N−1> as step pulses. Based on the resistance of resistor chain 156, outputs Vblk_level<0~N−1> of bulk voltage generator 150 are generated as fixed-level pulses or step voltages. Comparator 157 operates level controller 152 based on a comparison between a reference voltage Vref apparent across a ground resistor Rg.

Step controller 158 operates to control the resistance of resistor chain 156 in response to step signal STEP generated by erasing controller 140. Where step signal STEP is activated, step controller 158 sequentially switches resistor chain 156 in synchronization with a predetermined clock signal (not shown). By the sequential switching operation of the resistor chain, outputs of bulk voltage generator 150 are formed as step voltages. Where step signal STEP is deactivated, outputs of bulk voltage generator 150 are formed as fixed-level pulses.

Figure 4:
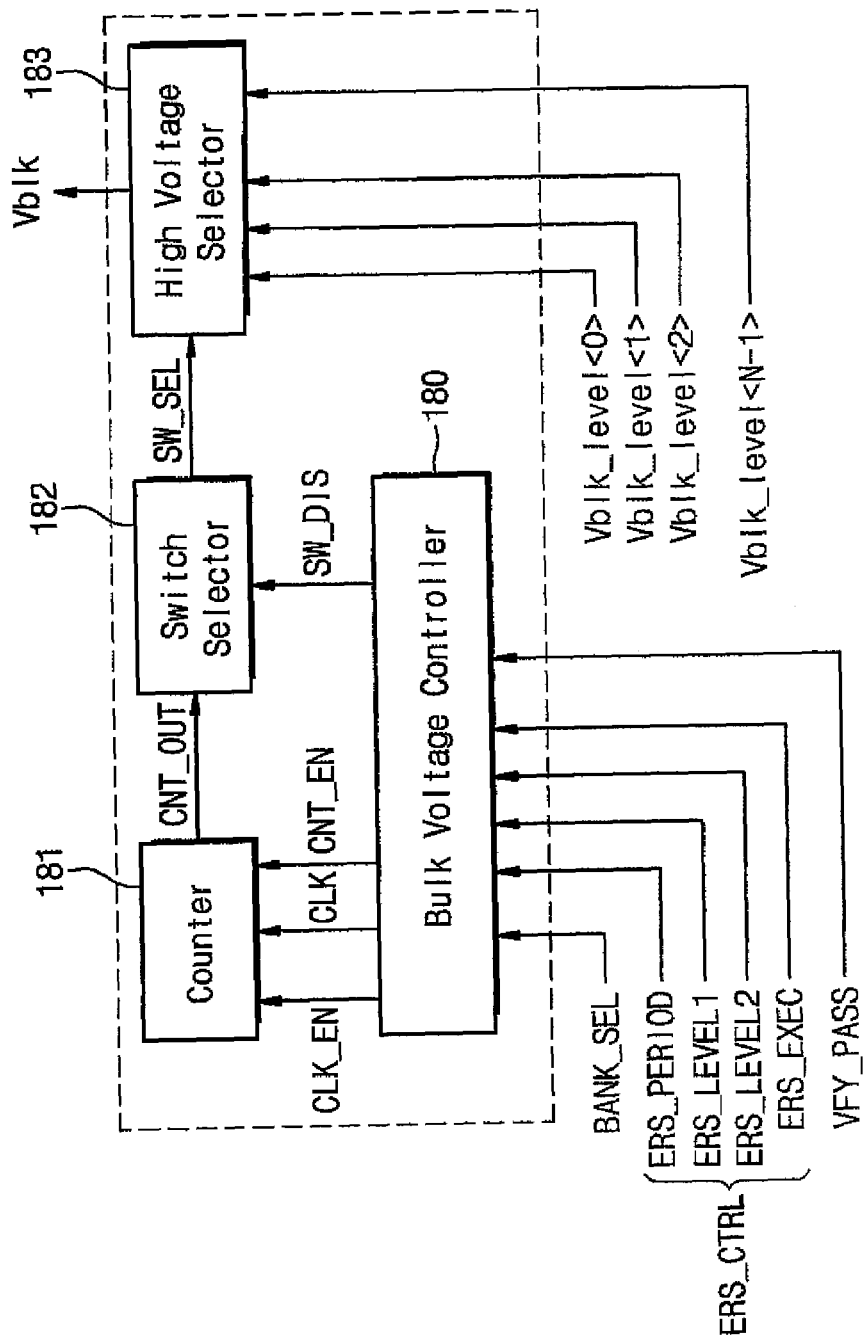
FIG. 4 is a block diagram of a bulk voltage selector shown in FIG. 2.

FIG. 4 is a block diagram of bulk voltage selector 171 shown in FIG. 2. Bulk voltage selector 171 is used to transfer bulk voltages to selected memory blocks of bank BANK<0>. Remaining bulk voltage selectors 172 through 174 corresponding to remaining banks BANK<1~7> have substantially the same structure and function as bulk voltage selector 171.

Referring to FIG. 4, bulk voltage selector 171 operates to select one of the plurality of bulk voltages output from bulk voltage generator 150 in response to erasing control signal ERS_CTRL, bank selection signal BANK_SEL, and erase-verify signal VFY_PASS. A selected voltage is provided to a bulk region of a memory block selected for erasure.

A bulk voltage controller (or switch) 180 is enabled or disabled in response to bank selection signal BANK_SEL. Bulk voltage controller 180 operates to control a counter 181 and a switch selector 182 in response to erasing control signal ERS_CTRL, which includes signals ERASE_PERIOD, ERS_LEVEL1, ERS_LEVEL2, and ERS_EXEC provided from erasing controller 140.

Here, an erase period signal ERASE_PERIOD provided from erasing controller 140 functions to define a term including first and second erase periods ERS_1 and ERS_2. A first erasing signal ERS_LEVEL1 functions to define a term of first erase period ERS_1, while a second erasing signal ERS_LEVEL2 functions to define a term of second erase period ERS_2. An erase-execution signal ERS_EXEC is provided as a clock signal for driving bulk voltage controller 180 during erase period ERASE_PERIOD, enabling general control operations in synchronization therewith.

During an erase operation, bulk voltage controller 180 generates control signals CNT_EN, CLK_EN, CLK, and SW_DIS in response to erasing control signal ERS_CTRL in order to conduct operations in first and second erase periods ERS_1 and ERS_2. Where erase-verify signal VFY_PASS indicates that all memory cells of a memory block have been successfully erased, bulk voltage controller 180 outputs a switch disabling signal SW_DIS to switch selector 182, interrupting the supply of a bulk voltage to a high voltage switch 183. In second erase period ERS_2, high voltage switch 183 is controlled to continuously supply a voltage of the same level as the last step pulse supplied to bank BANK<0> during first erase period ERS_1.

Counter 181 conducts a binary-counting operation in response to count-enabling signal CNT_EN, clock-enabling signal CLK_EN, and clock signal CLK which are provided from bulk voltage controller 180.

Switch selector 182 controls high voltage switch 183 in accordance with an output CNT_OUT provided from counter 181. Switch selector 182 outputs a switch selection signal SW_SEL to make high voltage switch 193 sequentially select step voltages Vblk_level<0~N−1> when counter output CNT_OUT is counted up. Switch selector 182 generates switch selection signal SW_SEL to continuously output a current voltage selected by high voltage switch 183 when counter output CNT_OUT is fixed to a constant value. However, where there is an input of a switch-disabling signal SW_DIS, switch selector 182 interrupts all step voltages to make bulk voltage Vblk of high voltage switch 183 output as 0V.

Switch selector 182 typically receives counter output signal CNT_OUT during second erase period ERS_2. However, during second erase period ERS_2, high voltage switch 183 outputs fixed-level pulses rather than step pulses.

Figure 5A:
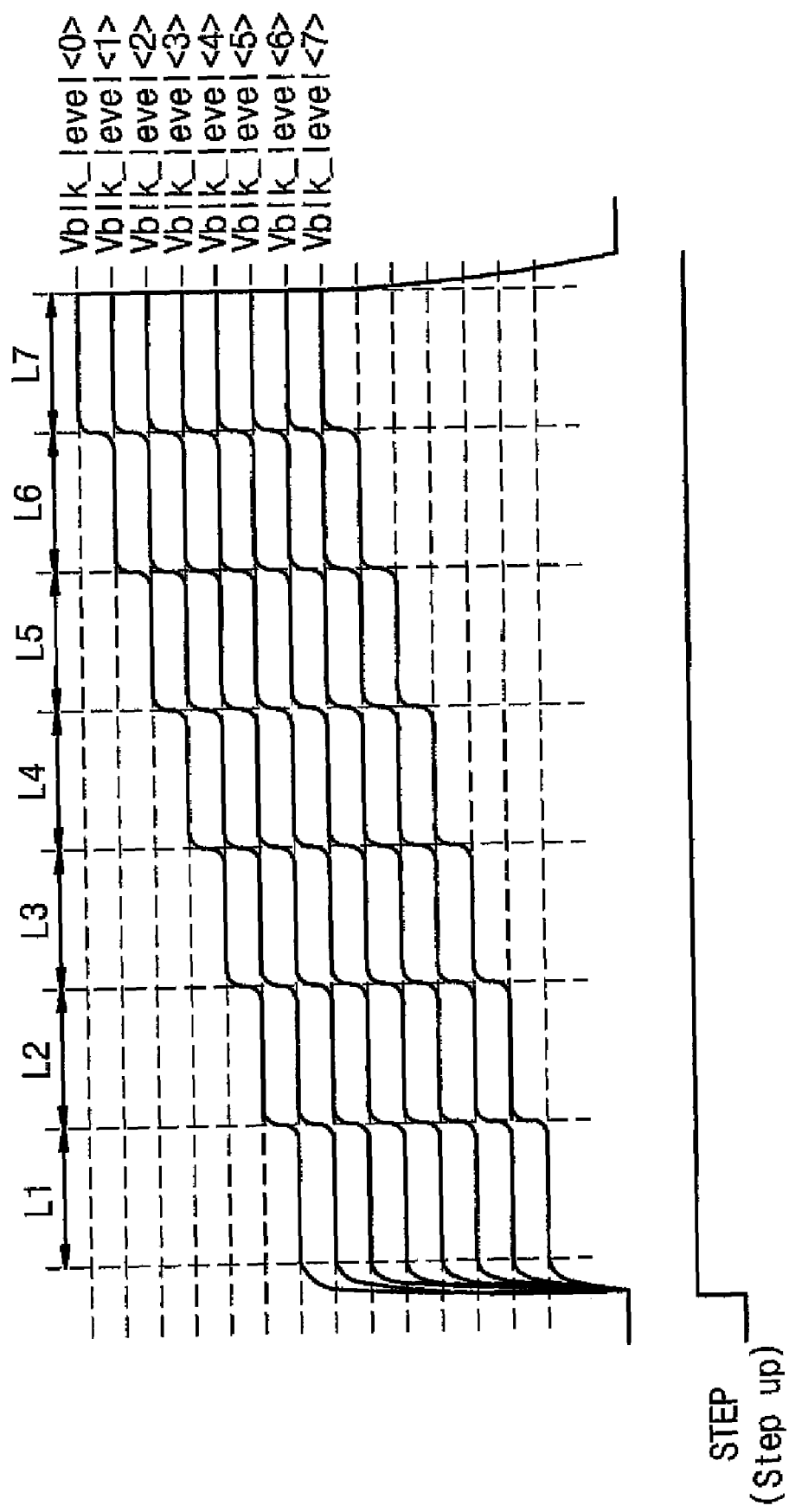
FIG. 5A is a waveform diagram illustrating outputs of the bulk voltage generator in accordance with an embodiment of the invention.

FIG. 5A is a waveform diagram illustrating outputs of bulk voltage generator 150 in accordance with an embodiment of the invention. More particularly, FIG. 5A illustrates bulk voltages Vblk_level<0~N−1> output from bulk voltage generator 150. For simplicity of explanation, bulk voltage generator 150 is illustrated as outputting eight different bulk voltages Vblk_level<0~7>.

While step signal STEP is activated (i.e., assumes a logic level "high"), bulk voltages Vblk_level<1~7> each increase by the same amount between successive erase loops. In the example of FIGS. 5A and 5B, it will be assumed that step signal STEP is activated during first erase period ERS_1 and deactivated during second erase period ERS_2. Because bulk voltages Vblk_level<1~7> each increase by the same amount between successive erase loops, bulk voltage Vblk_level<0> has the same level in a first erase loop "L1" that bulk voltage Vblk_level<1> has in a second erase loop "L2", bulk voltage Vblk_level<1> has the same level in second erase loop "L2" that bulk voltage Vblk_level<2> has in a third erase loop "L3", and so on.

As a result, as successive erase loops are performed, a desired output bulk voltage Vblk can be applied to a bulk region by switching between bulk voltages Vblk_level<0~7>. During second erase period ERS_2, bulk voltage selectors 171 through 174 supply their corresponding selected memory blocks with fixed-level pulses having the same magnitude as the last bulk voltage applied thereto during first erase period ERS_1.

FIG. 5B is a timing diagram illustrating the operation of bulk voltage selector 171 in accordance with the embodiment of FIG. 5A. While counter 181 is described as a 3-bit counter for convenience of description, other implementations are possible.

Where erase period signal ERASE_PERIOD and first erasing signal ERS_LEVEL1 are activated, bulk voltage controller 180 is enabled in synchronization with an initial rising edge of erase-execution signal ERS_EXEC. Where first erasing signal ERS_LEVEL1 is activated and before erase-verify signal VFY_PASS is activated, bulk voltage controller 180 deactivates count-enabling signal CNT_EN. As a result, counter output CNT_OUT maintains a state [000]. While counter output CNT_OUT remains in state [000] during first erase period ERS_1, switch selector 182 controls high voltage switch 183 to provide bulk voltage Vblk_level<0> as output bulk voltage Vblk. On the other hand, where counter output CNT_OUT assumes different states, high voltage switch 183 provides different bulk voltages among bulk voltages Vblk_level<1~7> as output bulk voltage Vblk.

Because high voltage switch 183 provides different bulk voltages as output voltage Vblk in response to counter output CNT_OUT, counter output CNT_OUT can be used to adjust the switching of high voltage switch 183 during second erase period ERS_2 in accordance with the duration of an inhibit period of output bulk voltage Vblk in first erase period Vblk. Accordingly, since bulk voltages Vblk_level<1~7> continue to increase during the inhibit period of output bulk voltage Vblk for bank BANK<0>, counter output CNT begins counting up as soon as the inhibit period begins and then maintains the same state during second erase period ERS_2 to provide an indication of which bulk voltage among bulk voltages Vblk_level<1~7> is output as bulk voltage Vblk during second erase period ERS_2.

As illustrated in FIG. 5B, after erase-verify signal VFY_PASS transitions to a logic level "high" switch-disabling signal SW_DIS, count-enabling signal CNT_EN, and clock-enabling signal CLK_EN transition to logic level "high". Then, counter 181 conducts a count-up operation during an activation time of clock-enabling signal CLK_EN, and is disabled when the erase operation is terminated by deactivation of erase period signal ERASE_PERIOD. In response to switch-disabling signal SW_DIS, switch selector 182 outputs switch selection signal SW_SEL (e.g., [00000000]) to high voltage switch 183 to prevent any of bulk voltages Vblk_level<0~7> from being output as output bulk voltage Vblk.

After all of the selected memory blocks have been successfully erased, first erase period ERS_1 is terminated and second erase period ERS_2 begins. Erasing controller 140 transitions second erasing signal ERS_LEVEL2 to logic level "high" to begin second erase period ERS_2. Then, bulk voltage controller 180 transitions switch-disabling signal SW_DIS into logic level "low". Once switch-disabling signal SW_DIS transitions to logic level "low", switch selection circuit 182 decodes counter output CNT_OUT and outputs switch selection signal SW_SEL accordingly.

In first erase period ERS_1, counter 181 continues the counting-up operation after erase-verify signal VFY_PASS is activated while high voltage switch 183 outputs bulk voltage Vblk with a fixed level. However, once second erase period ERS_2 begins, clock-enabling signal CLK_EN transitions to logic level "low" and counter output CNT_OUT remains in a state [001]. As a result, the bulk step voltage of first erase period ERS_1 is fixed as output bulk voltage Vblk during second erase period ERS_2.

Once erase-verify signal VFY_PASS transitions to logic level "high" during second erase period ERS_2, an overall procedure for erasing a corresponding memory block is terminated. Thus, switch-disabling signal SW_DIS transitions to logic level "high" to deactivate high voltage switch 183. In synchronization with this transition of switch-disabling signal SW_DIS, switch selector 182 outputs switch selection signal SW_SEL as [00000000] to interrupt output bulk voltage Vblk. Upon termination of second erase period ERS_2, erasing controller 140 deactivates erase period signal ERASE_PERIOD to terminate an overall procedure of erasing multi-block 110.

To briefly summarize the explanations of FIGS. 5A and 5B, bulk voltage generator 150 generates bulk voltages Vblk_level<0~N−1> each stepping up during first erase period ERS_1. During first erase period ERS_1, bulk voltage selection block 170 provides at least one of step voltages Vblk_level<0~N−1> to a corresponding bulk region. Bulk voltage selection block 170 interrupts the supply of output bulk voltage Vblk to each selected memory block for which erase-verify signal VFY_PASS indicates successful erasure. After first erase period ERS_1, second erase period ERS_2 begins.

During second erase period ERS_2, bulk voltage selectors 171 through 174 switch step voltages Vblk_level<0~N−1> and provide the bulk regions with fixed-level pulses. Accordingly, the memory device is able to provide memory blocks of multi-block 110 with step pulses and fixed-level pulses by switching bulk voltages Vblk_level<0~N−1> output from bulk voltage generator 150.

Figure 6A:
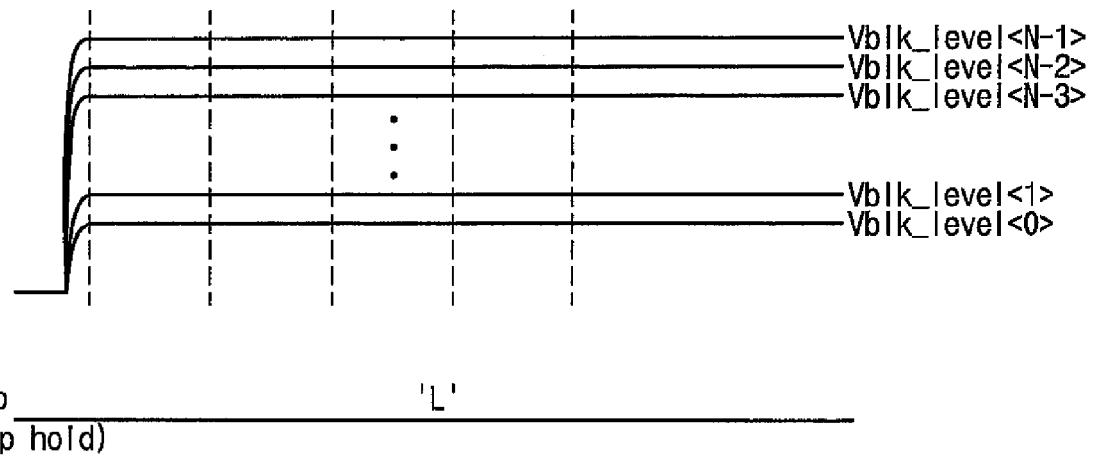
FIG. 6A is a waveform diagram illustrating outputs of the bulk voltage generator in accordance with another embodiment of the invention.

FIG. 6A is a waveform diagram illustrating outputs of bulk voltage generator 150 in accordance with another embodiment of the invention. Referring to FIG. 6A, in bulk voltage generator 150, as step signal STEP assumes logic level "low", bulk voltages Vblk_level<0~N−1> are generated with fixed voltage levels.

FIG. 6B is a timing diagram illustrating the operation of bulk voltage selector 171 in accordance with the embodiment of FIG. 6A. Although counter 181 is implemented in a 2-bit counter for convenience of description, other implementations are possible.

Referring to FIG. 6B, during first erase period ERS_1, bulk voltage selector 171 sequentially selects bulk voltages Vblk_level<0~N−1> output by bulk voltage generator 150 as output bulk voltage Vblk and provides output bulk voltage Vblk to the bulk region of a selected memory block of bank BANK<0> within multi-block 110. During second erase period ERS_2, bulk voltage selector 171 provides the bulk region of the selected memory block in bank BANK<0> with fixed-level pulses of magnitude substantially equal to that of the last output bulk voltage Vblk applied to the bulk region during first erase period ERS_1.

Where first erasing signal ERS_LEVEL1 is activated and before erase-verify signal VFY_PASS is activated during first erase period ERS_1, bulk voltage controller 180 transitions count-enabling signal CNT_EN to logic level "high" to enable counter 181. At the same time, switch selector 182 outputs switch selection signal SW_SEL with a state [0001] to cause high voltage switch 183 to output bulk voltage Vblk_level<0> as output bulk voltage Vblk from bulk voltage generator 150. Then, counter 181 conducts a counting-up operation to cause high voltage switch 183 to output a gradually higher voltage.

Where erase-verify signal VFY_PASS assumes logic level "high" during first erase period ERS_1, indicating successful erasure, bulk voltage controller 180 outputs switch-disabling signal SW_DIS and suspends the counting operation of counter 181. Thereafter, counter 181 maintains the same value until an overall procedure of erasing is terminated after second erase period ERS_2. In response to activation of switch-disabling signal SW_DIS, switch selector 182 outputs switch selection signal SW_SEL with state [0000] to high voltage switch 183 to interrupt the supply of output bulk voltage Vblk. As a result, during an inhibition period, a low voltage is applied to the bulk region of the selected memory block in bank BANK<0>.

In response to activation of second erasing signal ERS_LEVEL2, bulk voltage controller 180 deactivates switch-disabling signal SW_DIS at the beginning of second erase period ERS_2. Switch selector 182 outputs switch selection signal with state [0010] in response to a counted value [01] maintained during the inhibition period of first erase period ERS_1. Thus, during second erase period ERS_2, high voltage switch 183 maintains selection of the last bulk voltage applied to the selected memory block during first erase period ERS_1. Where erase-verify signal VFY_PASS transitions to logic level "high", second erasing signal ERS_LEVEL2 falls to logic level "low" and second erase period ERS_2 terminates.

Comparing the embodiments of FIGS. 5 and 6, bulk voltage generator 150 of FIG. 5A generates bulk voltages Vblk_level<1~7> with levels that increase by a fixed amount with each successive erase loop of first erase period ERS_1; in contrast, bulk voltage generator 150 of FIG. 6A generates each of bulk voltages Vblk_level<1~N−1> with the same level throughout first erase period ERS_1. Because of these differences, bulk voltage generator 150 for the embodiment of FIGS. 6A and 6B is required to have a larger range of output voltages with fixed levels compared with that of the embodiment of FIGS. 5A and 5B.

Figure 7:
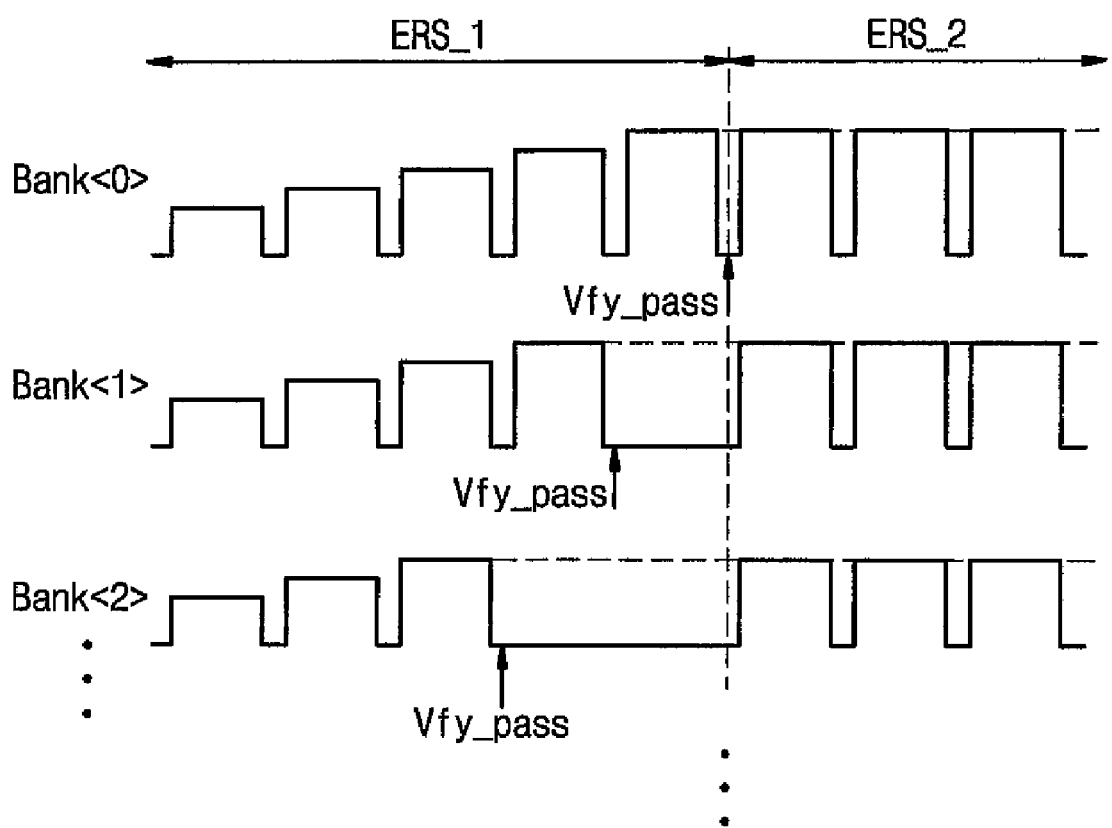
FIG. 7 is a waveform diagram of bulk voltages applied to selected memory blocks in a multi-block erase operation in accordance an embodiment of the invention.

FIG. 7 is a waveform diagram of bulk voltages applied to selected memory blocks in a multi-block erase operation in accordance with an embodiment of the invention. Referring to FIG. 7, the number of erase loops required to successfully erase selected memory blocks in first erase period ERS_1 may vary. Accordingly, as seen in FIG. 7, a device can prevent step pulses from being applied to selected memory blocks that have been successfully erased during first erase period ERS_1. Then, during second erase period ERS_2, fixed-level pulses having the same respective magnitudes as the last step pulses applied to the selected memory blocks in first erase period ERS_1 are applied to the respective selected memory blocks.

As described above, in selected embodiments of the invention, different bulk voltages are applied to different selected memory blocks during first and second erase periods of a multi-block erase operation. As a result, each erased memory block in a device using selected embodiments of the invention will tend to have a relatively well regulated threshold voltage distribution compared with memory blocks erased by conventional methods, and the device will tend to have improved reliability, speed, and power consumption compared with conventional devices.

The foregoing exemplary embodiments are teaching examples. Those of ordinary skill in the art will understand that various changes in form and details may be made to the exemplary embodiments without departing from the scope of the invention as defined by the following claims.

What is claimed:

1. A method of performing a multi-block erase operation in a flash memory device, wherein the multi-block erase operation comprises first and second erase periods, the method comprising:

in the first erase period, performing a first plurality of erase loops on a plurality of memory blocks, wherein performing an initial one of the first plurality of erase loops comprises applying respective bulk voltages to each of the plurality of memory blocks and detecting whether each of the plurality of memory blocks has been successfully erased, and wherein performing subsequent erase loops among the plurality of erase loops comprises applying respective stepped-up bulk voltages to each of the plurality of memory blocks that has not been detected to be successfully erased while interrupting the supply of bulk voltages to any of the plurality of memory blocks that has been detected to be successfully erased; and in the second erase period, performing a second plurality of erase loops on the plurality of memory blocks, wherein performing each of the second plurality of erase loops comprises applying a respective fixed-level bulk voltage to each one of the plurality of memory blocks, wherein each respective fixed-level bulk voltage is defined by a last stepped-up bulk voltage applied to the corresponding one of the plurality of memory blocks during the first erase period.

2. The method of claim 1, wherein the plurality of memory blocks form a memory bank.

3. A method of performing a multi-block erase operation in a flash memory device, wherein the multi-block erase operation comprises first and second erase periods. the method comprising:

in the first erase period, performing a first plurality of erase loops on a plurality of memory blocks, wherein performing an initial one of the first plurality of erase loops comprises applying respective bulk voltages to each of the plurality of memory blocks and detecting whether each of the plurality of memory blocks has been successfully erased, and wherein performing subsequent erase loops among the plurality of erase loops comprises applying respective stepped-up bulk voltages to each of the plurality of memory blocks that has not been detected to be successfully erased while interrupting the supply of bulk voltages to any of the plurality of memory blocks that has been detected to be successfully erased;

in the second erase period, performing a second plurality of erase loops on the plurality of memory blocks, wherein performing each of the second plurality of erase loops comprises applying respective fixed-level bulk voltages to the plurality of memory blocks; and for each memory block in the plurality of memory blocks, storing a last stepped-up bulk voltage applied to the memory block upon detecting that the memory block has been successfully erased in the first erase period.

4. The method of claim 1, wherein each of the stepped-up bulk voltages is generated by increasing the level of a bulk voltage signal output by a bulk voltage generator before each corresponding one of the subsequent erase loops.

5. A method of performing a multi-block erase operation in a flash memory device, wherein the multi-block erase operation comprises first and second erase periods, the method comprising:

in the first erase period, performing a first plurality of erase loops on a plurality of memory blocks, wherein performing an initial one of the first plurality of erase loops comprises applying respective bulk voltages to each of the plurality of memory blocks and detecting whether each of the plurality of memory blocks has been successfully erased, and wherein performing subsequent erase loops among the plurality of erase loops comprises applying respective stepped-up bulk voltages to each of the plurality of memory blocks that has not been detected to be successfully erased while interrupting the supply of bulk voltages to any of the plurality of memory blocks that has been detected to be successfully erased; and in the second erase period, performing a second plurality of erase loops on the plurality of memory blocks, wherein performing each of the second plurality of erase loops comprises applying respective fixed-level bulk voltages to the plurality of memory blocks, wherein each of the stepped-up bulk voltages applied to the plurality of memory blocks is generated by switching between one fixed-level signal output by a bulk voltage generator and another fixed-level signal output by the bulk voltage generator before each corresponding one of the subsequent erase loops, wherein another fixed-level signal output by the bulk voltage generator has a higher level than the one fixed-level signal output by the bulk voltage generator.

6. The method of claim 4, wherein the bulk voltage signal output by the bulk voltage generator has a highest level among a plurality of bulk voltage signals output by the bulk voltage generator during each subsequent erase loop.

7. The method of claim 6, further comprising:

in the first erase period, upon detecting that one of the memory blocks is successfully erased, storing a voltage level of a last stepped-up bulk voltage applied to the one of the memory blocks and interrupting the supply of any bulk voltage from the bulk voltage generator to the one of the memory blocks for the remainder of the first erase period.

8. The method of claim 7, wherein the respective fixed-level bulk voltages applied to the plurality of memory blocks in the second erase period are each generated by selecting among the plurality of bulk voltage signals output by the bulk voltage generator.

9. The method of claim 7, wherein the amplitude of each fixed-level erase voltage applied to each memory block in the second erase period is substantially the same as or higher than the amplitude of the last bulk voltage applied to the corresponding memory block in the first erase period.

10. The method of claim 1, wherein each of the stepped-up bulk voltages applied to the plurality of memory blocks is generated by switching between one fixed-level signal output by a bulk voltage generator and another fixed-level signal output by the bulk voltage generator before each corresponding one of the subsequent erase loops, wherein another fixed-level signal output by the bulk voltage generator has a higher level than the one fixed-level signal output by the bulk voltage generator.

* * * * *